United States Patent
Lin

(10) Patent No.: US 9,083,299 B2
(45) Date of Patent: Jul. 14, 2015

(54) FILTER OF ADJUSTABLE FREQUENCY RESPONSE AND METHOD THEREOF

(75) Inventor: Chia-Liang Lin, Union City, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 2502 days.

(21) Appl. No.: 11/553,452

(22) Filed: Oct. 26, 2006

(65) Prior Publication Data

US 2008/0100372 A1     May 1, 2008

(51) Int. Cl.
*H03D 5/00* (2006.01)
*H04B 1/18* (2006.01)
*H04B 1/16* (2006.01)
*H03H 2/00* (2006.01)

(52) U.S. Cl.
CPC ............ *H03H 2/00* (2013.01); *H03H 2250/00* (2013.01)

(58) Field of Classification Search
USPC .............. 455/132–133, 139–140, 143, 176.1, 455/179.1–180.1, 188.1, 307, 339, 340, 68, 455/280; 375/152, 343, 350
See application file for complete search history.

(56) References Cited

U.S. PATENT DOCUMENTS

| | | | |
|---|---|---|---|
| 4,761,829 A * | 8/1988 | Lynk et al. | 455/307 |
| 4,792,993 A * | 12/1988 | Ma | 455/266 |
| 5,023,939 A * | 6/1991 | Hori | 455/188.1 |
| 5,758,296 A * | 5/1998 | Nakamura | 455/575.7 |
| 5,883,553 A * | 3/1999 | Tsumura | 333/174 |
| 6,313,620 B1 * | 11/2001 | Richardson et al. | 324/76.31 |
| 6,515,981 B1 * | 2/2003 | Schilling et al. | 370/342 |
| 6,583,662 B1 * | 6/2003 | Lim | 327/553 |
| 6,658,245 B2 * | 12/2003 | Li et al. | 455/307 |
| 6,973,144 B1 * | 12/2005 | Zhu et al. | 375/350 |
| 7,006,805 B1 * | 2/2006 | Sorrells et al. | 455/188.1 |
| 7,039,382 B2 | 5/2006 | Shu | |
| 7,068,987 B2 | 6/2006 | Baldwin et al. | |
| 7,072,427 B2 | 7/2006 | Rawlins et al. | |
| 7,085,335 B2 | 8/2006 | Rawlins et al. | |
| 7,095,454 B2 * | 8/2006 | Waight et al. | 348/731 |
| 7,231,189 B2 * | 6/2007 | Rowe et al. | 455/78 |
| 7,477,694 B2 * | 1/2009 | Sanderford et al. | 375/261 |
| 7,526,052 B2 * | 4/2009 | Davidoff et al. | 375/350 |
| 2001/0055322 A1 * | 12/2001 | Domon | 370/537 |
| 2003/0007568 A1 * | 1/2003 | Hamery et al. | 375/240.26 |
| 2003/0153294 A1 * | 8/2003 | Hata | 455/302 |
| 2006/0252419 A1 * | 11/2006 | Liu | 455/423 |
| 2007/0057721 A1 * | 3/2007 | Risbo et al. | 330/10 |
| 2008/0252366 A1 * | 10/2008 | Chang | 327/557 |

OTHER PUBLICATIONS

Foreign Office Action for 1002063303001 TW mailed Jul. 21, 2011.

* cited by examiner

*Primary Examiner* — Simon Nguyen
(74) *Attorney, Agent, or Firm* — McClure, Qualey & Rodack, LLP

(57) ABSTRACT

A filter of an adjustable frequency response comprises a plurality of filters having a plurality of distinct frequency responses, respectively. These filters receive a common input signal and generate a plurality of intermediate signals, respectively. A multiplexing circuit is used to select one of these intermediate signals as a filtered signal. The multiplexing circuit is controlled by a control signal that is related to a state of the filtered signal.

20 Claims, 4 Drawing Sheets

FILTER OF ADJUSTABLE FREQUENCY RESPONSE AND METHOD THEREOF

BACKGROUND OF THE INVENTION

1. Field of the Invention

The present invention relates to filter, in particular to filter of an adjustable frequency response.

2. Description of Related Art

Filter is an important building block in numerous systems. A filter can be implemented using either a passive circuit or an active circuit. A passive filter comprises a plurality of passive elements, including: resistor, capacitor, and inductor. An active filter comprises at least one operational amplifier and a plurality of passive elements, including resistor and capacitor. A filter receives an input signal and generates an output signal in response. The input signal is usually comprised of various frequency components, and the filter responds to different frequency components differently. The frequency dependence of a filter's response to its input is referred to as the frequency response of that filter. Based on its frequency response, a filter usually falls into one of the four categories: low-pass filter, high-pass filter, band-pass filter, and all-pass filter. A high-pass filter, for instance, has a high-pass frequency response, where high-frequency components are preserved while low-frequency components are greatly attenuated in the output, so to speak. Although the current invention is applicable to any of the four categories, a high-pass filter is used by way of example but not limitation.

A high-pass filter is characterized by a cut-off frequency. Components of frequencies well above the cut-off frequency are considered high-frequency components and will be preserved in the output, while components of frequencies well below the cut-off frequency are considered low-frequency components and will be greatly attenuated in the output. Components of frequencies near the cut-off frequency are considered transition-band components and are not well preserved nor greatly attenuated in the output.

FIG. 1 depicts a prior art passive high-pass filter 100 comprising a capacitor C and a resistor R. The cut-off frequency of this high-pass filter is $1/(2\pi\sqrt{RC})$, assuming the source (at the input node) has very low output impedance and the load (at the output node) has very high input impedance.

In some applications, it is necessary to adjust the frequency response of a filter while the filter is continually receiving an input signal. One common way of adjusting the frequency response of a filter on the fly is to use a tunable circuit element, e.g. a tunable resistor. A tunable circuit element can be tuned either mechanically or electronically. In an integrated circuit, a tunable circuit element can be tuned only electronically. An electronically tunable circuit element usually has poor linearity unless the tunability is based on using switch. FIG. 2 depicts a switch-based adjustable high-pass filter 200 comprising a capacitor C, a first resistor $R_1$, a second resistor $R_2$, and a switch S. The switch S is controlled by a logical signal (not shown in the figure). When the logical signal is in a first state, the switch S is open and the cut-off frequency of the high-pass filter 200 is $1/(2\pi\sqrt{R_1C})$. When the logical signal is in a second state, the switch S is closed and the cut-off frequency of the high-pass filter 200 is $1/(2\pi\sqrt{R_1R_2C/(R_1+R_2)})$, as the two resistors $R_1$ and resistor $R_2$ are connected in parallel and result in an effective resistance $R_1R_2/(R_1+R_2)$.

An adjustable filter based on using a switched circuit element has a drawback that every time the switched circuit element switches from one configuration to another it introduces a disturbance to the system. The disturbance is only a transient phenomenon and will fade out eventually. However, the system suffers from a performance degrade during the transition period.

What is needed is a method to adjust the filter response without introducing a disturbance to the system.

BRIEF SUMMARY OF THIS INVENTION

In an embodiment, an adjustable filter is disclosed, the filter comprising: a plurality of filters of distinct frequency responses for receiving a common input signal and for generating a plurality of filtered signals, respectively; a multiplexing circuit controlled by a control signal for generating an output signal by selecting among said filtered signals.

In an embodiment, a receiver is disclosed, the receiver comprises: a front-end circuit for receiving an input signal and generating a processed signal; a plurality of filters for filtering the processed signal and generating a plurality of intermediate signals, respectively; a multiplexing circuit controlled by a control signal for generating a filtered signal by selecting among said intermediate signals; a back-end circuit for receiving the filtered signal and generating a digital data; and a digital circuit for processing the digital data and generating the control signal.

In an embodiment a method for receiving an input signal is disclosed, the method comprising: processing the input signal using a front-end circuit to generate a processed signal; filtering the processed signal using a plurality of filters to generate a plurality of intermediate signals, respectively; generating a filtered signal by selecting among said intermediate signals based on a state of a control signal; processing the filtered signal to generate a digital data; and processing the digital data to generate an output data and the control signal.

BRIEF DESCRIPTION OF THE DRAWINGS

The subject matter regarded as the invention is particularly pointed out and distinctly claimed in the concluding portion of the specification. The invention, both as to device and method of operation, together with features and advantages thereof may best be understood by reference to the following detailed description with the accompanying drawings in which:

DETAILED DESCRIPTION OF THIS INVENTION

The present invention relates to adjustable filter. While the specifications describe several example embodiments of the invention considered best modes of practicing the invention, it should be understood that the invention can be implemented in many ways and is not limited to the particular examples described below or to the particular manner in which any features of such examples are implemented.

The present invention is general and applicable to adjustable filter of any kind, regardless of property of frequency selection (low-pass, high-pass, band-pass, and all-pass), filter order ($1^{st}$ order, $2^{nd}$ order, and so on), and circuit type (passive and active). In an embodiment depicted in FIG. 3A, an adjustable filter 300 comprises: a first filter 310 of a first frequency response, a second filter 320 of a second frequency response, and a multiplexing circuit 330. The first filter 310 receives an input signal IN and generates a first output signal OUT_0. The second filter 320 receives the same input signal and generates a second output signal OUT_1. The multiplexing circuit 330 generates an output signal OUT by selecting between OUT_0 and OUT_1 based on a logical control signal SEL. When SEL=0, OUT_0 is selected. When SEL=1, OUT_0 is selected. In this manner, the adjustable filter 300 has a frequency response adjustable between the first frequency response and the second frequency response. To those of ordinary skill in the art, the concept can be easily generalized to having more than two frequency responses.

Figure 3A:
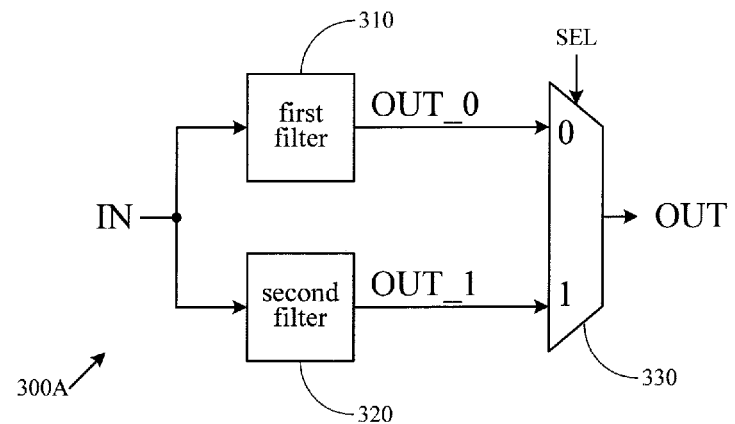
FIG. 3A depicts an embodiment of an adjustable filter in accordance with the present invention.
Figure 3B:
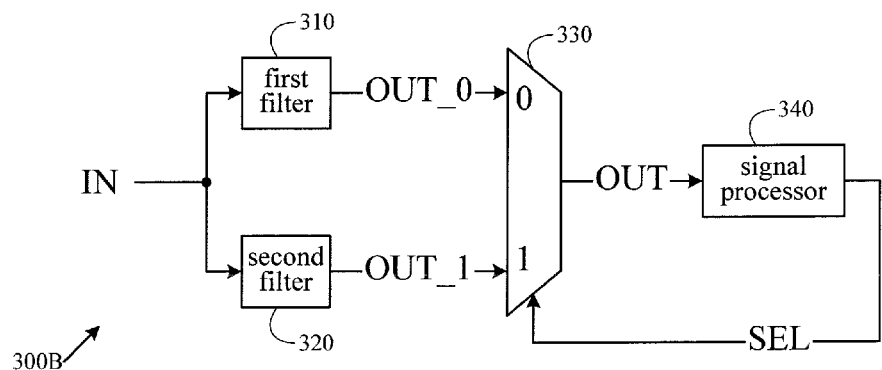
FIG. 3B depicts a further embodiment of the adjustable filter of FIG. 3A.

In a further embodiment depicted in FIG. 3B, the control signal is generated by processing the output signal OUT using a signal processor 340. The signal processor 340 comprises at least part of the following functions: analog-to-digital conversion, filtering, demodulation, detection, and timing synchronization.

Figure 4:
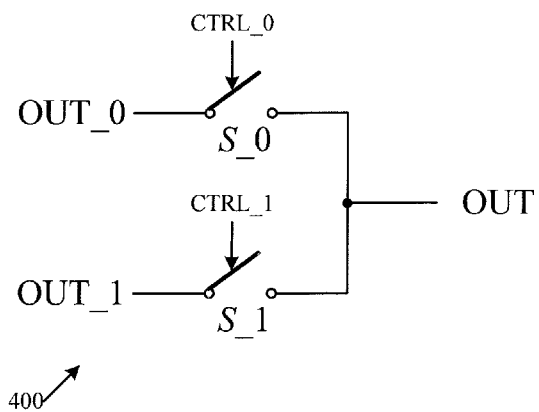
FIG. 4 depicts an embodiment of a multiplexing circuit for the adjustable filter of FIG. 3A and of FIG. 3B.

FIG. 4 shows a multiplexing circuit 400, which is an exemplary embodiment for the multiplexing circuit 330 of FIG. 3A and of FIG. 3B. The multiplexing circuit 400 comprises a first switch S_0 controlled by a first logical signal CTRL_0, and a second switch S_1 controlled by a second logical signal CTRL_1, where CTRL_0 is equal to SEL and CTRL_1 is a logical inversion of SEL. In this manner, OUT_0 is coupled to OUT when SEL=0, and OUT_1 is coupled to OUT when SEL=1. In a general embodiment, a multiplexing circuit comprises a plurality of switches controlled by a plurality of logical signals, respectively, and these logical signals are derived from the control signal so that one and only one of the inputs to the multiplexing circuit is selected.

In an embodiment, one of the first filter 310 and the second filter 320 is an active circuit comprising an operational amplifier, and the active circuit is at least partially powered down to save power when its corresponding filtered output (i.e. OUT_0 for filter 310, or OUT_1 for filter 320) is not selected as the output signal OUT.

Now refer back to FIG. 3. The disturbance will be very small when we switch from one frequency response to another if both the first filter 310 and the second filter 320 have very low output impedance. When a circuit has very low output impedance, its output voltage is highly insensitive to its load circuit. As a result, both OUT_0 and OUT_1 are highly insensitive to a change of state of the multiplexing circuit 330 regardless of the value of SEL. Therefore, the output OUT can be switched between OUT_0 and OUT_1 without introducing a significant disturbance to the system. For an active filter whose output is generated from an operational amplifier, the output impedance is usually sufficiently low. For a passive filter, a buffer circuit is needed to buffer the output to guarantee sufficiently low output impedance.

The disturbance will also be very small when we switch from one frequency response to another if the load (at the output node) has very high input impedance. When the load (at the output node) has very high input impedance, both the first filter 310 and the second filter 320 will see a load circuit having very high input impedance regardless of the state of the multiplexing circuit 330. As a result, both OUT_0 and OUT_1 are highly insensitive to a change of state of the multiplexing circuit 330. Therefore, the output OUT can be switched between OUT_0 and OUT_1 without introducing a significant disturbance to the system. The input impedance of the load circuit is usually sufficiently high if the load circuit is a buffer circuit.

Figure 1:
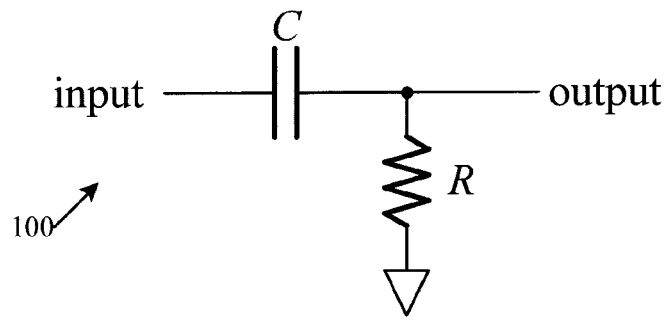
FIG. 1 depicts a prior art high-pass filter.
Figure 2:
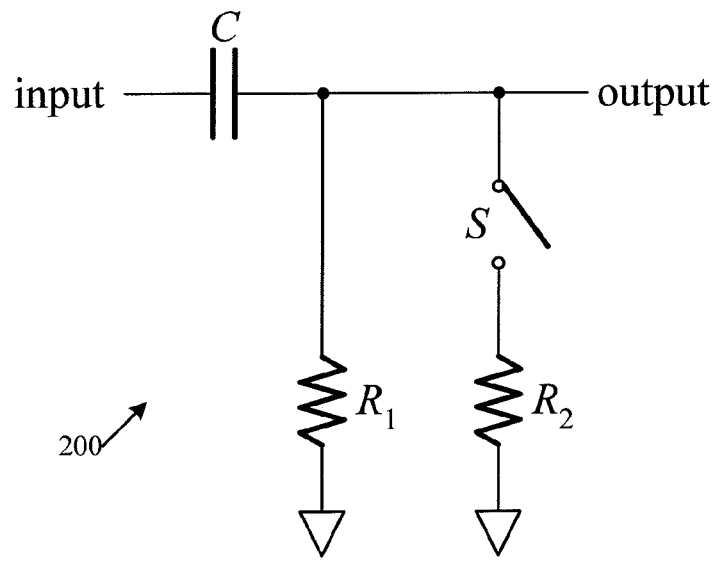
FIG. 2 depicts a prior art adjustable high-pass filter.
Figure 5:
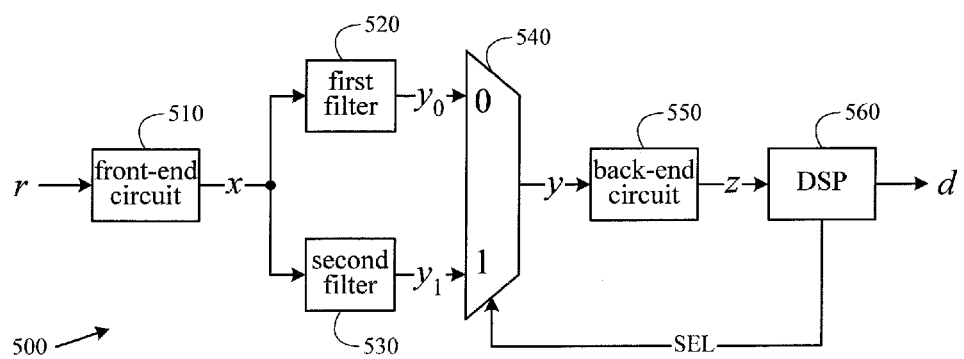
FIG. 5 depicts a receiver using an adjustable filter in accordance with the present invention.
Figure 6:
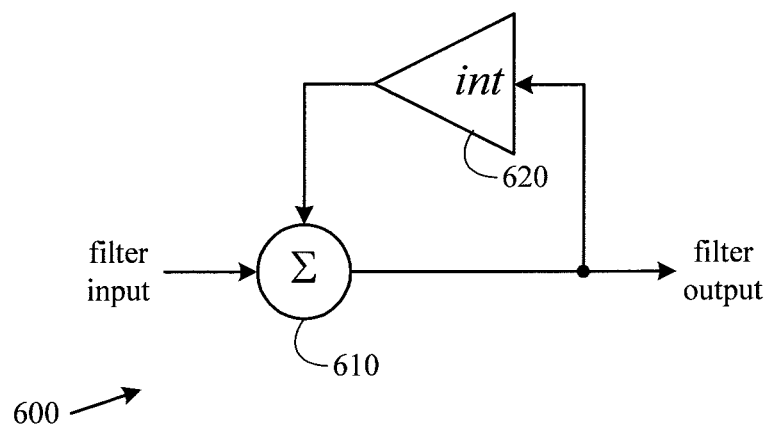
FIG. 6 depicts an exemplary servo loop.

FIG. 5 depicts an embodiment of a communication receiver 500 using an adaptive filter in accordance with the present invention. The communication receiver 500 comprises: a front-end circuit 510 for receiving an input signal r and generating a processed signal x; a first filter 520 for filtering the processed signal x and generating a first filtered signal $y_0$; a second filter 530 for filtering the processed signal x and generating a second filtered signal $y_1$; a multiplexing circuit 540 controlled by a control signal SEL for generating a multiplexed signal y by selecting between the first filter signal $y_0$ and the second filtered signal $y_1$; a back-end circuit 550 for further processing the multiplexed signal y and generating a digital signal z; and a digital circuit 560 (ex: DSP (digital signal processing)) for generating an output data d by processing the digital signal z and also for generating the control signal SEL. The input signal r is a modulated signal carrying certain information. In an embodiment, the input signal r is an OFDM (orthogonal frequency-division multiplexing) signal carrying information using a plurality of sub-carriers. The front-end circuit 510 comprises a low-noise amplifier to provide a gain to the input signal. In an embodiment, the front-end circuit further comprises a frequency down-conversion circuit. The first filter 520 has a first frequency response, while the second filter 530 has a second frequency response. In an embodiment, the first filter 520 is a high-pass filter with a first cut-off frequency, and the second filter 530 is a high-pass filter with a second cut-off frequency. The multiplexing circuit 540 selects the first filtered signal $y_0$ as the multiplexed signal y when the control signal SEL is of a first value (0), and selects the second filtered signal $y_1$ as the multiplexed signal y when the control signal SEL is of a second value (1). The back-end circuit 550 comprises an amplifier and an analog-to-digital converter. The DSP 560 comprises a demodulator for extracting the information embedded in the digital data d. In an embodiment, the digital data d comprises a first segment and a second segment. In an embodiment, the DSP 560 sets the control signal SEL to the first value (0) during receiving the first segment, and sets the control signal SEL to the second value (1) during receiving the second segment. In an embodiment, the first segment is a preamble and the second segment is a payload. In an embodiment, both the first filter 520 and the second filter 530 have very low output impedance. In an embodiment the back-end circuit 550 has very high input impedance. In an embodiment, the multiplexing circuit 540 comprises a plurality of switches controlled by a plurality of signals derived from the control signal SEL. In an embodiment, at least one of the first filter 520 and the second filter 530 is an active circuit comprising an operational amplifier, and the active circuit is at least partially powered down to save power when its filtered output (i.e. $y_0$ or $y_1$) is not selected by the multiplexing circuit 540. In an embodiment, at least one of the first filter 520 and the second filter 530 is a passive circuit comprising a capacitor. In an embodiment, at least one of the first filter 520 and the second filter 530 is a RC filter comprising a resistor and a capacitor, like the filter 100 depicted in FIG. 1. In an embodiment, at least one of the first filter 520 and the second filter 530 is a servo loop 600 comprising an integrator 620 and a summing circuit 610, as depicted in FIG. 6.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit comprising:
a plurality of filters of distinct frequency responses for receiving a common input signal and for generating a plurality of filtered signals, respectively, the input signal comprising a preamble and a payload;
a multiplexing circuit having a plurality of inputs directly connected, in one-to-one correspondence with the plurality of filtered signals, the multiplexing circuit controlled by a control signal and configured to generate an output signal by selecting among said filtered signals based on a value of the control signal; and
a signal processor for generating the control signal by processing the output signal, the signal processor having an input directly connected to the output signal, wherein the signal processor is configured to generate the control signal such that the signal output by the multiplexing circuit is a first filtered signal among the plurality of filtered signals when the preamble of the input signal is received by the signal processor and the signal output by the multiplexing circuit is a second filtered signal among the plurality of filtered signals when the payload of the input signal is received by the signal processor.

2. The circuit of claim 1, wherein said filters all have low output impedances that are substantially lower than the input impedances of their respective load circuits regardless of a state of the control signal.

3. The circuit of claim 1, wherein the output signal is terminated by a circuit having a high output impedance that is substantially higher than the output impedance of the multiplexing circuit regardless of a state of the control signal.

4. The circuit of claim 1, wherein the multiplexing circuit comprises a plurality of switches controlled by a plurality of signals derived from a state of the control signal.

5. The circuit of claim 1, wherein one of said filters is a passive circuit comprising a capacitor.

6. The circuit of claim 1, wherein one of said filters is an active circuit comprising an operational amplifier.

7. The circuit of claim 1, wherein at least one of said filters is powered down to save power when its corresponding filtered signal is not selected.

8. A receiver comprising:
a front-end circuit for receiving an input signal comprising a preamble and a payload and generating a processed signal;
a plurality of filters for receiving the processed signal and generating a plurality of intermediate signals, respectively;
a multiplexing circuit controlled by a control signal for generating a filtered signal by selecting among said intermediate signals based on a value of the control signal, wherein the multiplexing circuit has a plurality of inputs directly connected in a one-to-one relationship with the intermediate signals; and
a signal processor for receiving the filtered signal to generate the control signal, the signal processor having an input directly connected to the filtered signal, wherein the signal processor is configured to process the filtered signal to generate the control signal such that the filtered signal is a first intermediate signal among the plurality of intermediate signals when the preamble of the input signal is received and the filtered signal is a second intermediate signal among the plurality of intermediate signals when the payload of the input signal is received.

9. The receiver of claim 8, wherein the signal processor further comprising:
a back-end circuit for receiving the filtered signal and generating a digital data; and
a digital circuit for processing the digital data to generate an output data and the control signal.

10. The receiver of claim 9, wherein the output data comprises a first segment and a second segment.

11. The receiver of claim 10, wherein a first intermediate signal among said intermediate signals is selected during when the digital circuit is receiving the first segment of the output data, and a second intermediate signal among said intermediate signals is selected during when the digital circuit is receiving the second segment of the output data.

12. The receiver of claim 8, wherein the multiplexing signal comprises a plurality of switches controlled by a plurality of signals derived from a state of the control signal.

13. The receiver of claim 8, wherein at least one of said filters is powered down to save power when its corresponding intermediate signal is not selected.

14. The receiver of claim 8, wherein the signal processor comprises at least part of the following functions: analog-to-digital conversion, filtering, demodulation, detection, and timing synchronization.

15. A method for receiving an input signal, the method comprising:
processing the input signal using a front-end circuit to generate a processed signal, the input signal comprising a preamble and a payload;
filtering the processed signal using a plurality of filters to generate a plurality of intermediate signals, respectively;
selecting, based on a value of a control signal, one among said intermediate signals to output as a filtered signal; and
processing, by a signal processor, the filtered signal to generate the control signal that is used to select among the intermediate signals, wherein the filtered signal is processed to generate the control signal such that the filtered signal is a first intermediate signal among the plurality of intermediate signals when the preamble of the input signal is received by the signal processor and the filtered signal is a second intermediate signal among the plurality of intermediate signals when the payload of the input signal is received by the signal processor.

16. The method of claim 15, wherein the step of processing the filtered signal comprising:
processing the filtered signal to generate a digital data; and
processing the digital data to generate an output data and the control signal.

17. A method of claim 15, wherein the step of selecting further comprises using a plurality of switches controlled by a plurality of signals derived from the state of the control signal.

18. The method of claim 15, wherein at least one of said filters is a passive filter comprising a capacitor.

19. The method of claim 15, wherein at least one of said filter is an active filter comprising an operational amplifier.

20. A receiver circuit comprising:
a front-end circuit to receive an input signal comprising a preamble and a payload and generate a processed signal according to the input signal;
first and second filters to receive the processed signal and generate a first and a second intermediate signals, respectively;
a multiplexing circuit controlled by a control signal for generating a filtered signal by selecting among said intermediate signals; and a signal processor, coupled to the multiplexing circuit, to process the filtered signal to generate the control signal such that the filtered signal is said first intermediate signal when the preamble of the input signal is received and the filtered signal is said second intermediate signal when the payload of the input signal is received.

* * * * *